(12) United States Patent
Minamio et al.

(10) Patent No.: US 8,018,526 B2
(45) Date of Patent: Sep. 13, 2011

(54) OPTICAL DEVICE MODULE, FABRICATION METHOD THEREOF, OPTICAL DEVICE UNIT AND FABRICATION METHOD THEREOF

(75) Inventors: Masanori Minamio, Osaka (JP); Yutaka Harada, Kyoto (JP); Yoshiki Takayama, Shiga (JP); Toshiyuki Fukuda, Kyoto (JP)

(73) Assignee: Panasonic Corporation, Osaka (JP)

( * ) Notice: Subject to any disclaimer, the term of this patent is extended or adjusted under 35 U.S.C. 154(b) by 777 days.

(21) Appl. No.: 11/798,370

(22) Filed: May 14, 2007

(65) Prior Publication Data
US 2008/0100732 A1    May 1, 2008

(30) Foreign Application Priority Data
Oct. 25, 2006    (JP) .................. 2006-290021

(51) Int. Cl.
    *H04N 5/225*    (2006.01)
(52) U.S. Cl. .................. 348/373; 348/207.99
(58) Field of Classification Search .................. 348/294, 348/207.99, 373–376
See application file for complete search history.

(56) References Cited

U.S. PATENT DOCUMENTS

| | | | | |
|---|---|---|---|---|
| 5,616,050 A | * | 4/1997 | Suski | 439/495 |
| 6,118,666 A | * | 9/2000 | Aoki et al. | 361/749 |
| 6,384,397 B1 | * | 5/2002 | Takiar et al. | 250/208.1 |
| 6,624,520 B1 | * | 9/2003 | Nakamura | 257/778 |
| 6,950,314 B2 | * | 9/2005 | Reznik et al. | 361/764 |
| 2001/0024848 A1 | * | 9/2001 | Nakamura | 438/200 |
| 2001/0055073 A1 | * | 12/2001 | Shinomiya | 348/374 |
| 2002/0145676 A1 | * | 10/2002 | Kuno et al. | 348/340 |
| 2003/0016300 A1 | * | 1/2003 | Ting | 348/335 |
| 2005/0285973 A1 | * | 12/2005 | Singh et al. | 348/374 |
| 2006/0257081 A1 | * | 11/2006 | Ishigami et al. | 385/92 |

FOREIGN PATENT DOCUMENTS

| | | |
|---|---|---|
| JP | 10-004185 | 1/1998 |
| JP | 11-271646 | 10/1999 |
| JP | 2000-210252 | 8/2000 |

* cited by examiner

*Primary Examiner* — Nhan T Tran
*Assistant Examiner* — Tuan Le
(74) *Attorney, Agent, or Firm* — McDermott Will & Emery LLP

(57) ABSTRACT

One end of a flexible substrate is connected to a solid-state image sensing device and the other end constitutes an external connection part in which external lead-out electrodes are provided. A plurality of electronic components are mounted on a mounting part of the flexible substrate. The flexible substrate is bent at a first bent part thereof to make an acute angle with the solid-state image sensing device and also bent at a second bent part thereof to make an acute angle with the external connection part. The two acute angles are alternate angles and the solid-state image sensing device has a cross section of the letter Z.

20 Claims, 11 Drawing Sheets

OPTICAL DEVICE MODULE, FABRICATION METHOD THEREOF, OPTICAL DEVICE UNIT AND FABRICATION METHOD THEREOF

CROSS-REFERENCE TO RELATED APPLICATION

The disclosure of Japanese Patent Application No. 2006-290021 filed Oct. 25, 2006 which includes specification, drawings and claims is incorporated herein by reference in its entirely.

BACKGROUND OF THE INVENTION (a) Field of the Invention

This invention relates to optical device modules and particularly relates to optical device modules including an optical device, a flexible substrate connected to the optical device and electronic componentry mounted on the flexible substrate.

(b) Description of the Related Art

In recent years, optical device modules have been developed in which an optical device having a light receiving/emitting function and a drive circuit for the optical device are integrated. Examples of such an optical device module include optical pickups used as for reading DVDs with the optical device and camera modules for mobile phones. There is a demand for these optical device modules to be downsized according to size reduction of built-in components.

More specifically, examples of the above optical device module are solid-state image sensing device modules (image sensing modules) using as an optical device a solid-state image sensing device, such as a charge-coupled image sensing device (CCD), a static induction transistor image sensing device (SIT) or a charge modulation image sensing device (CMD). These solid-state image sensing device modules are often built in compact camera units. These solid-state image sensing device modules are used in a manner incorporated in a hardened tip of an insertion tube inserted in the compact camera unit. Such a compact camera unit is demanded to have a tip shorter and narrower in outer diameter because of use in archeological excavation, for search for narrow spaces in disasters and for internal investigation of artifacts. From this point of view, it is important how a solid-state image sensing device module is downsized. In addition, in order to release compact camera units at low price, it is also an important challenge to improve the assembly efficiency of solid state image sensing device modules and thereby save the production cost.

There is known a solid-state image sensing device module intended to attain size reduction and cost saving, wherein leads on a flexible substrate having an IC and a chip component mounted thereon are bent and connected to bumps on a particular edge of a solid-state image sensing device and the back surface of the IC is adhered to the back surface of the solid-state image sensing device (see, for example, Published Japanese Patent Application No. H11-271646).

FIG. 13 is a conceptual cross-sectional view showing the structure of the known solid-state image sensing device module disclosed in the above document.

As shown in FIG. 13, first, a solid-state image sensing device 102, a semiconductor device (an IC chip) 103, a chip component 104 are mounted on a flexible substrate 101 and the flexible substrate 101 is connected to external signal lines 105. Thereafter, the flexible substrate 101 is bent at right angles at three locations so that the bottom surface of the solid-state image sensing device 102 and the top surface of the IC chip 103 are opposed to each other. Both the surfaces are adhered to each other by an adhesive 122. Then, the side surfaces of the chip component 104 are adhered to opposed parts of the bent substrate 101 by unshown adhesive. In this manner, a solid-state image sensing device module for an electronic endoscope is formed with a compact configuration. The above Published Japanese Patent Application No. H11-271646 describes that since the solid-state image sensing device module is configured by bending the flexible substrate 101 in a rectangular shape and adhering the back surfaces of the IC chip 103 and the solid-state image sensing device 102 to each other, this provides size reduction and cost saving without deteriorating working efficiency.

There is also known another solid-state image sensing device module intended to attain size reduction, wherein a flexible substrate is bent in the shape of a box, electronic components are mounted on the flexible substrate inner surfaces of the box shape and a solid-state image sensing device is connected to terminals on the bottom of the flexible substrate (see, for example, Published Japanese Patent Application No. 2000-210252). The Published Japanese Patent Application No. 2000-210252 describes that since the flexible substrate is bent in the shape of a box all surfaces of which are rectangular and electronic components are mounted on the substrate inner surfaces of the box shape, the image sensing unit can be downsized, thereby narrowing and downsizing the endoscope tip.

SUMMARY OF THE INVENTION

Problems to Be Solved by the Invention

The above solid-state image sensing device module disclosed in Published Japanese Patent Application No. H11-271646 is formed by bending the flexible substrate at right angles and adhering the back surfaces of the IC chip and the solid-state image sensing device to each other. Therefore, according to this technique, the bending must be carried out to control the bending positions and angles of the flexible substrate with high accuracy. This makes it difficult to fabricate the solid-state image sensing device module and increases the production cost.

Furthermore, since the back surfaces of the IC chip and the solid-state image sensing device are adhered to each other, the solid-state image sensing device module is rigidified. The solid-state image sensing device module is housed in a tubular housing of the endoscope to form a tip thereof. However, since the housing is designed to have substantially an equal inner diameter to the outer dimension of the solid-state image sensing device module in order to downsize the endoscope, the rigid solid-state image sensing device module is lodged on the way to insertion into the housing, thereby deteriorating the workability. In addition, since the above technique involves the step of adhering the back surfaces of the components to each other, this invites a problem of cost rise.

On the other hand, the solid-state image sensing device module disclosed in Published Japanese Patent Application No. 2000-210252 is formed by bending the flexible substrate in the shape of a box and mounting electronic components on the inner surfaces of the box shape. Therefore, according to this technique, the box shape of the flexible substrate must be formed with highly accurate dimensions. Furthermore, the box shape rigidifies the solid-state image sensing device module. Therefore, like the known art disclosed in Published Japanese Patent Application No. H11-271646, it becomes difficult to fabricate the solid-state image sensing device module, thereby increasing the production cost. Furthermore, the insertion of the solid-state image sensing device module into the housing is not easy, thereby deteriorating the workability and in turn increasing the cost.

The present invention has been made to solve the above problems and its object is to provide an optical device module that can be easily fabricated, can be downsized and can be easily inserted into the housing.

Means to Solve the Problems

To solve the above problems, an optical device module according to the present invention has the following configuration.

Specifically, an optical device module according to the present invention includes an optical device, a flexible substrate connected to the optical device and electronic componentry mounted on the flexible substrate. The flexible substrate comprises: a contact terminal part located at one end of the flexible substrate and connected to the optical device; an external connection part located at the other end of the flexible substrate and connected to an external device; a mounting part on which the electronic componentry is mounted, the mounting part being located between the contact terminal part and the external connection part; a first bent part located between the mounting part and the contact terminal part; and a second bent part located between the mounting part and the external connection part. The flexible substrate is bent at the first bent part so that a back surface of the optical device opposite to an optically functional surface thereof makes an acute angle with the mounting part of the flexible substrate, and the flexible substrate is also bent at the second bent part so that the external connection part makes an acute angle with the mounting part and the acute angle between the external connection part and the mounting part and the acute angle between the back surface of the optical device and the mounting part are alternate angles. The term "external device" used herein refers to, for example, a power supply or a signal input/output device. The term "flexible substrate" used herein refers to a bendable and flexible substrate and examples of the "flexible substrate" include a substrate obtained by bonding a copper foil to a polyimide film or a liquid crystal polymer film and a substrate obtained by forming a copper layer by plating on a polyimide film or a liquid crystal polymer film. The electronic componentry includes a semiconductor device, such as a driver for driving the optical device, and passive electronic components, such as a capacitor or a resistor.

With the above configuration, a plurality of electronic components can be disposed between the optically functional surface of the optical device and the external connection part, thereby providing size reduction and the flexibility of the flexible substrate as a whole module. As a result, the module can be easily inserted into the housing.

In a preferred embodiment, the electronic componentry comprises a plurality of electronic components, and the mounting part of the flexible substrate comprises a first mounting region on which some of the plurality of electronic components are mounted, a second mounting region on which the rest of the plurality of electronic components are mounted and a connecting region connecting between the first and second mounting regions and is bent at the connecting region.

In another preferred embodiment, each of the first and second mounting regions has a mounting surface on which the electronic componentry is mounted and a non-mounting surface opposite to the mounting surface, and the flexible substrate is bent at the connecting region so that the non-mounting surfaces of the first and second mounting regions face each other.

In still another preferred embodiment, the flexible substrate further comprises a through electrode passing through the flexible substrate, the electronic componentry comprises at least one electronic component mounted on one surface of the flexible substrate and at least one electronic component mounted on the other surface of the flexible substrate, and the through electrode electrically connects said at least one electronic component mounted on the one surface of the flexible substrate to said at least one electronic component mounted on the other surface of the flexible substrate.

The optical device may be a solid-state image sensing device. Furthermore, a transparent material is preferably adhered to the light acceptance surface of the solid-state image sensing device.

In a preferred embodiment, the flexible substrate is formed of a film carrier tape and the film carrier tape is removed in the first bent part.

A protective film is preferably provided over the first bent part.

In a preferred embodiment, the film carrier tape is removed in the second bent part and a protective film is instead provided over the second bent part.

A reinforcing resin is preferably disposed on the contact terminal part. The reinforcing resin preferably covers the contact terminal part and more preferably also covers the electrodes of the optical device connecting to the contact terminal part.

An optical device unit according to the present invention comprises: the above-mentioned optical device module; and a housing containing the optical device module, wherein the flexible substrate in the housing is partly deformed by the application of stress.

In a preferred embodiment, the housing further contains a heat sink material at least the surface of which has electrical insulation. In this case, from the viewpoint that heat produced by the optical device module should be effectively released to the outside, the heat sink material is preferably a material having a heat conductivity 100 times or more that of air at normal temperature and more preferably a material having a heat conductivity 2000 times or more that of air at normal temperature.

A method for fabricating an optical device module according to the present invention is a method for fabricating an optical device module comprising an optical device, a flexible substrate connected to the optical device and electronic componentry mounted on the flexible substrate and comprises the steps of: preparing the flexible substrate which comprises a contact terminal part located at one end of the flexible substrate for being connected to the optical device, an external connection part located at the other end of the flexible substrate for being connected to an external device and a mounting part located between the contact terminal part and the external connection part and allowing a plurality of electronic components to be mounted thereon and on a surface of which a wiring pattern is formed; mounting the plurality of electronic components on the mounting part of the flexible substrate; electrically connecting the contact terminal part of the flexible substrate to the optical device; bending a part of the flexible substrate adjacent to the contact terminal part so that the back surface of the optical device opposite to an optically functional surface thereof makes an acute angle with the mounting part; and bending another part of the flexible substrate adjacent to the external connection part so that the external connection part makes an acute angle with the mounting part and the acute angle between the external connection part and the mounting part and the acute angle between the back surface of the optical device and the mounting part are alternate angles.

A method for fabricating an optical device unit according to the present invention is a method for fabricating an optical device unit comprising the above-mentioned optical device module and a housing containing the optical device module and comprises the steps of: preparing the optical device module; and inserting the optical device module into the housing so that the optical device module is contained in the housing with the flexible substrate partly deformed by the application of stress.

In a preferred embodiment, the method for fabricating an optical device unit further comprises the step of containing into the housing a heat sink material at least the surface of which has electrical insulation.

DETAILED DESCRIPTION OF THE INVENTION

Figure 1A:
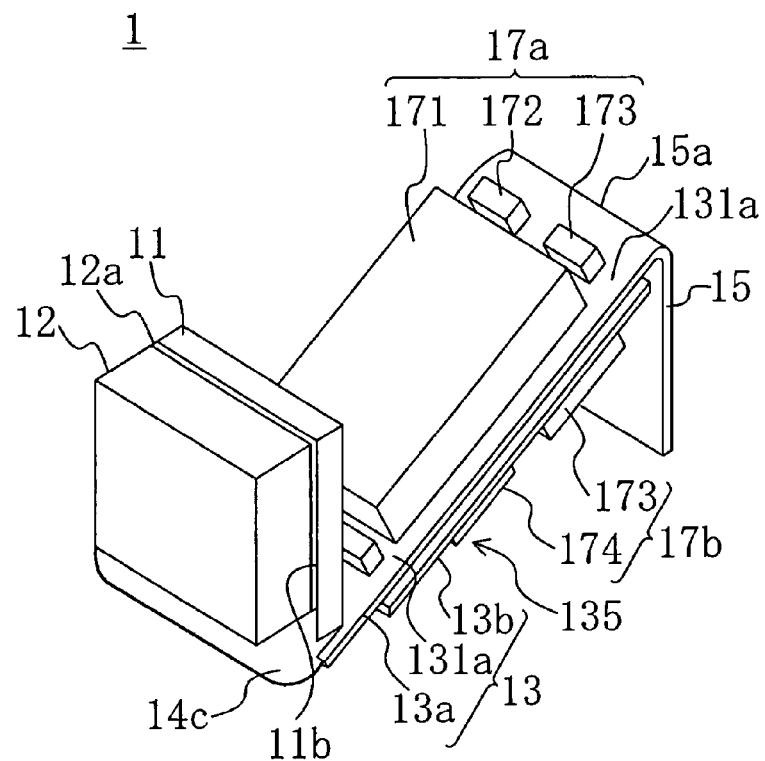
FIG. 1(a) is a conceptual perspective view showing the structure of a solid-state image sensing device module according to a first embodiment of the present invention and FIG. 1(b) is a conceptual perspective view of the solid-state image sensing device module in FIG. 1(a) when viewed from the reverse side.

A description will be given below of embodiments of the present invention with reference to the drawings. For simplicity of explanation, elements having substantially the same functions are designated by the same reference numerals in the following drawings. Although the following embodiments describe a compact camera module and a compact camera unit that use a solid-state image sensing device as an optical device, the present invention is applicable to other optical device modules and optical device units using a laser device or an LED that are other optical devices.

First Embodiment

-Solid-State Image Sensing Device Module-

Figure 1B:
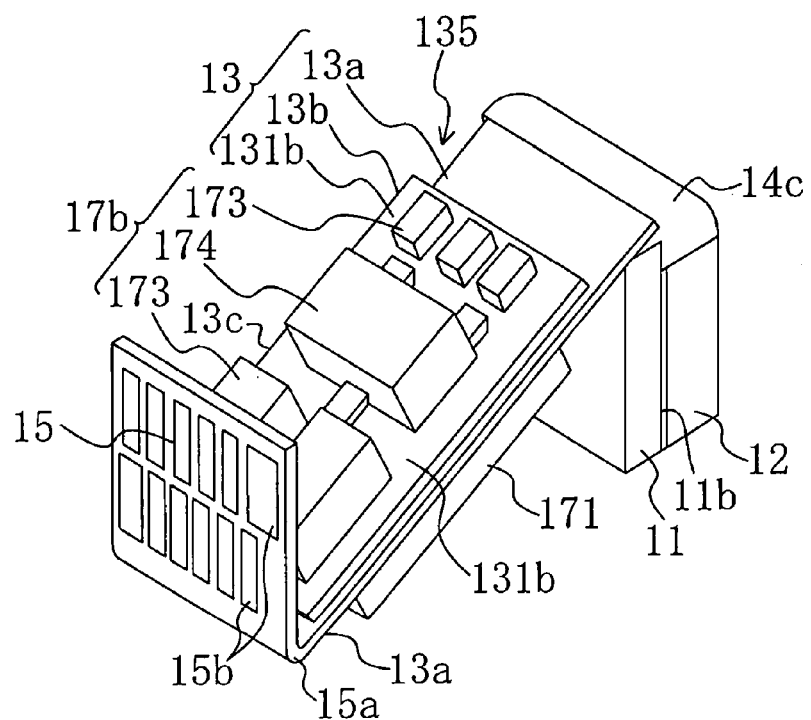

FIG. 1(a) is a conceptual perspective view showing the structure of a solid-state image sensing device module (optical device module) 1 according to a first embodiment of the present invention and FIG. 1(b) is a conceptual perspective view of the solid-state image sensing device module in FIG. 1(a) when viewed from below.

Figure 2A:
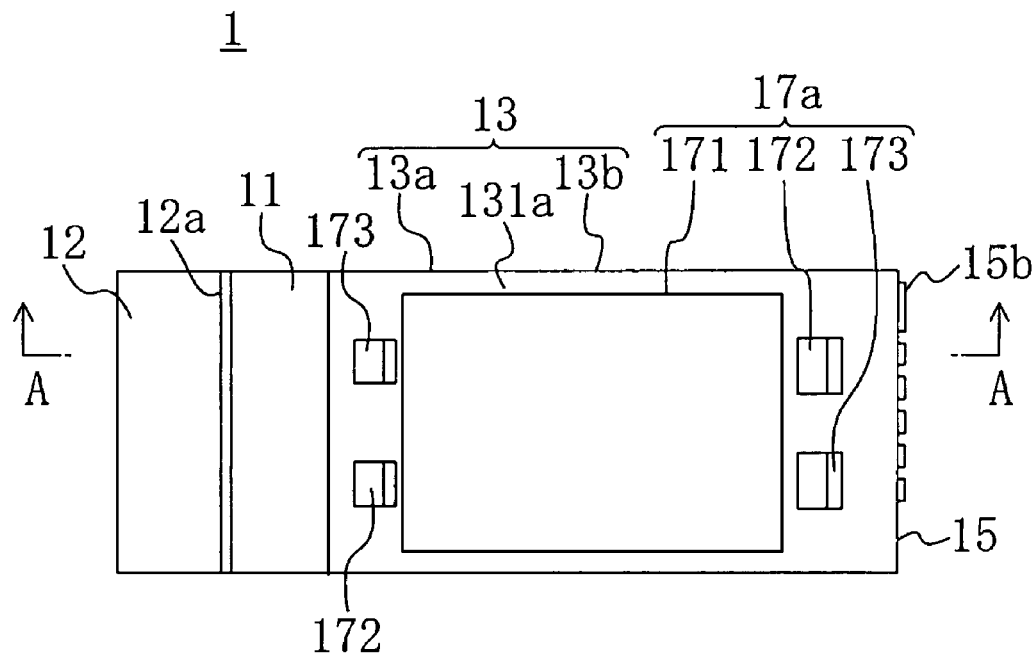
FIG. 2(a) is a conceptual plan view showing the structure of the solid-state image sensing device module according to the first embodiment and FIG. 2(b) is a conceptual cross-sectional view taken along the line A-A of FIG. 2(a).
Figure 2B:
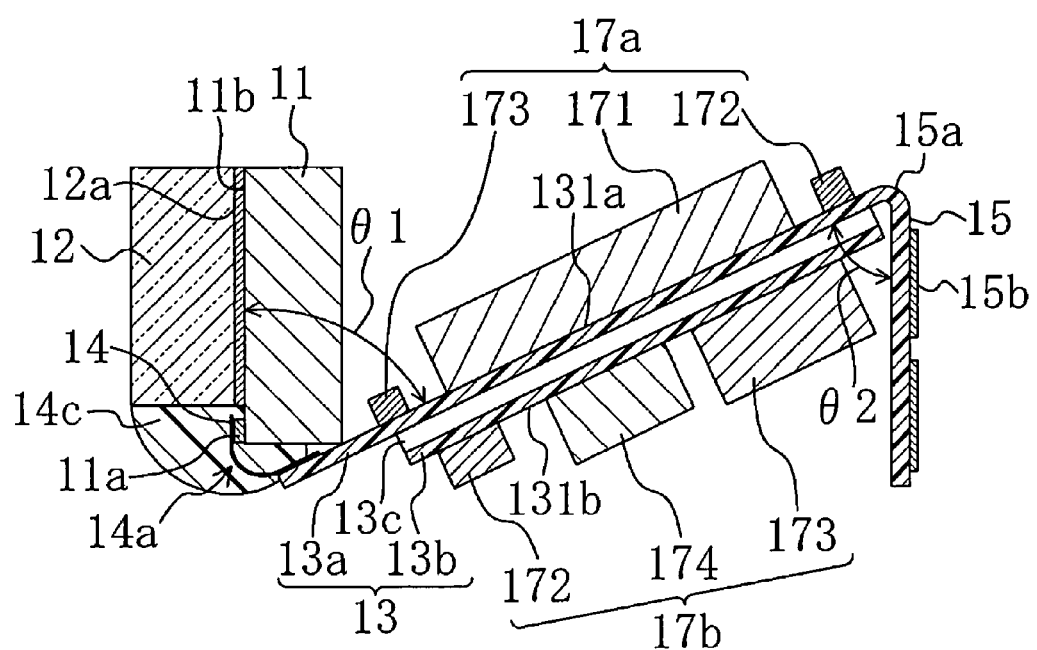

FIG. 2(a) is a conceptual plan view showing the structure of the solid-state image sensing device module 1 according to the first embodiment and FIG. 2(b) is a conceptual cross-sectional view taken along the line A-A of FIG. 2(a).

As shown in FIGS. 1 and 2, the solid-state image sensing device module 1 includes a solid-state image sensing device (optical device) 11, such as a CCD (charge-coupled image sensing device), and a flexible substrate (for example, polyimide resin substrate) 13 having flexibility. The solid-state image sensing device module 1 further includes electronic componentry 17a mounted on a substrate principal surface 131a which is one of the two surfaces of the flexible substrate 13. The electronic componentry 17a constitutes part of a peripheral circuit for driving the solid-state image sensing device 11. The flexible substrate 13 is provided at one end with a contact terminal part 14 through which the flexible substrate 13 is connected to the solid-state image sensing device 11 and also provided at the other end with an external connection part 15. The external connection part 15 has external lead-out electrodes 15b mounted at least on the substrate principal surface 131a to connect with external leads (not shown) for power supply to the solid-state image sensing device module 1 and signal communication.

In this embodiment, a tape automated bonding (TAB) substrate (film carrier tape) is used as the flexible substrate 13 and a wiring pattern (not shown) is provided on the substrate principal surface 131a by attaching a metal foil, such as a copper foil, onto the substrate principal surface 131a and patterning it by etching. Therefore, the flexible substrate 13 in this embodiment is a one-sided wiring substrate having a wiring pattern only on one surface. The wiring pattern is formed to connect with the contact terminal part 14 and the external connection part 15. A region of the flexible substrate 13 between the contact terminal part 14 and the external connection part 15 is a mounting part 135 on which two sets of electronic componentry 17a and 17b are mounted. A first bent part 14a is formed between the contact terminal part 14 and the mounting part 135 and a second bent part 15a is formed between the external connection part 15 and the mounting part 135.

As shown in FIG. 2(b), the solid-state image sensing device module 1 according to this embodiment has the shape of the letter Z as viewed in a cross section taken along the line A-A of FIG. 2(a). Specifically, the contact terminal part 14 is connected to bumps 11a serving as electrodes for the solid-state image sensing device 11 and is bent out at the first bent part 14a from the mounting part 135 so that the back surface of the solid-state image sensing device 11 opposite to the light acceptance surface (optically functional surface) 11b thereof makes an acute angle θ1 with the mounting part 13b. The external connection part 15 is bent out at the second bent part 15a from the mounting part 13b to make an acute angle θ2 with the mounting part 13b. The two acute angles θ1 and θ2 are alternate angles. In other words, the light acceptance surface 11b and the external connection part 15 are substantially parallel to each other and the angle θ1 made between the light acceptance surface 11b and the mounting part 13b and the angle θ2 made between the external connection part 15 and the mounting part 13b are mathematically alternate angles. Note that even if the light acceptance surface 11b and the external connection part 15 are not parallel to each other, the two acute angles θ1 and θ2 are alternate angles. Furthermore, it will be sufficient if the acute angle θ2 is an angle made between a portion of the external connection pat 15 near the second bent part 15a and the mounting part 13b, and the external connection pat 15 may be curved.

The light acceptance surface 11b is oriented in an image sensing direction that is opposite to the mounting part 13b of the flexible substrate 13. In other words, the acute angle θ1 made between the device back surface opposite to the light acceptance surface 11b and the mounting part 13b is formed so that the light acceptance surface 11b of the solid-state image sensing device 11 is oriented in the opposite direction to the mounting part 13b. Although in FIG. 2(b) the light acceptance surface 11b and the external connection part 15 are substantially parallel to each other, they are not necessarily equal to each other. In other words, the solid-state image sensing device module 1 according to this embodiment has the shape of the letter Z or the letter N as viewed in a plane including the acute angle θ1 made between the light acceptance surface 11b and the mounting part 13b. Furthermore, the acute angle θ1 is an angle made between the device back surface opposite to the light acceptance surface 11b and the substrate principal surface 131a of the mounting part 13b and the acute angle θ2 is an angle made between the external connection part 15 and the substrate principal surface 131a of the mounting part 13b. Note that the mounting part 13b may not be perfectly flat but may be slightly distorted or curved.

A reinforcing resin 14c is disposed on and around the contact terminal part 14 to protect the connecting part between the contact terminal part 14 and the solid-state image sensing device 11. The reinforcing resin 14c is also disposed on and around the first bent part 14a and partly covers the film on the flexible substrate 13. Thus, the connecting part between the solid-state image sensing device 11 and the flexible substrate 13 is reinforced with the reinforcing resin 14c. Therefore, the connection reliability can be enhanced and the end of the flexible substrate 13 disposed inclined to the solid-state image sensing device 11 can be fixed at an acute angle θ1 that is a specified angle.

Since the solid-state image sensing device module 1 has such a Z-shape, the mounting part 13b is located towards the back surface of the solid-state image sensing device 11 (the opposite surface thereof to the light acceptance surface 11b) and all the two sets of electronic componentry 17a and 17b hide behind the back surface of the solid-state image sensing device 11 when the light acceptance surface 11b is viewed in a direction of incident light towards the light acceptance surface 11b. Therefore, the camera module can be downsized. Furthermore, a wide surface area of the external connection part 15 can be secured, which provides reliable electric connection.

In this embodiment, the film is removed in a region of the flexible substrate 13 corresponding to the first bent part 14a, and the first bent part 14a and the contact terminal part 14 are formed so that metal wires project from one end of the flexible substrate 13. Since the first bent part 14a is formed only of metal wires, it is more flexible and bendable than having the film left on it. Therefore, its radius of curvature can be reduced and the solid-state image sensing device module 1 can be made more compact. According to the above structure in which the TAB substrate is used and the flexible substrate 13 is connected to the bumps 11a of the solid-state image sensing device 11 by inner lead bonding (ILB), the solid-state image sensing device 11 can be formed into a more compact chip and have a larger number of pins. This makes the solid-state image sensing device module 1 further compact.

Hence, since the solid-state image sensing device module 1 has a cross section of the letter Z and a flexible and mechanically compliant structure, the insertion of the solid-state image sensing device module 1 into a tubular housing of specified dimensions can be easily carried out even if the tolerance of the dimensional accuracy of the solid-state image sensing device module 1 is widened.

In this embodiment, the solid-state image sensing device 11 is not contained in a protective container and is connected as a bare chip to the flexible substrate 13. An optical element 12 is adhered to the light acceptance surface 11b by a transparent adhesive 12a to serve as a protective cover. The optical element 12 is made of, for example, a clear glass plate, and has a profile and a surface area larger than those of the light acceptance region of the light acceptance surface 11b and smaller than those of the light acceptance surface 11b of the solid-state image sensing device 11. Since, thus, the solid-state image sensing device 11 is not contained in a protective container but is used as a bare chip and the optical element 12 is disposed directly on the light acceptance surface 11b of the solid-state image sensing device 11 by adhesion, this also provides size reduction of the solid-state image sensing device module 1. In addition, the light acceptance surface 11b can be prevented from being covered with dust or damaged, which enhances the reliability and image quality. Furthermore, the solid-state image sensing device 11 is provided with the bumps 11a on the peripheral part of the light acceptance surface 11b and connected to one end of the contact terminal part 14 by bump bonding.

The mounting part 13b includes a first mounting region 13a, a second mounting region 13b and a connecting region 13c connecting between the first and second mounting regions 13a and 13b. Electronic componentry 17a constituting part of a peripheral circuit for driving the solid-state image sensing device 11 is mounted on the substrate principal surface 131a of the first mounting region 13a located between the contact terminal part 14 and the external connection part 15. The electronic componentry 17a comprises a plurality of electronic components including a semiconductor device 171 such as a driver IC chip, a chip resistor 172 and chip capacitor 173. Another electronic componentry 17b constituting part of the peripheral circuit for driving the solid-state image sensing device 11 is mounted on a substrate principal surface 131b of the second mounting region 13b. Note that the substrate principal surface 131a of the first mounting region 13a and the substrate principal surface 131b of the second mounting region 13b are the same surface of the flexible substrate 13. The latter electronic componentry 17b also comprises a plurality of electronic components and includes a transistor 174 and passive components, such as a chip resistor and a chip capacitor. The second mounting region 13b on which the latter electronic componentry 17b is mounted is folded back at 180° from the mounting surface of the first mounting region 13a on which the former electronic componentry 17a is mounted, i.e., folded back to the non-mounting surface of the first mounting region 13a which is the opposite side to the mounting surface, so that the non-mounting surface of the first mounting region 13a faces the non-mounting surface of the second mounting region 13b. Therefore, the mounting surface of the first mounting region 13a is the substrate principal surface 131a, the mounting surface of the second mounting region 13b is the substrate principal surface 131b and the non-mounting surface of the second mounting region 13b is the opposite surface to the mounting surface thereof. According to this structure, a large number of electronic components 17a and 17b can be mounted in a limited narrow space, the plurality of electronic components 17a and 17b necessary to constitute the peripheral circuit for driving the solid-state image sensing device 11 can be compactly mounted in a narrow space and, thereby, the solid-state image sensing device module can be downsized.

-Camera Unit-

Figure 3:
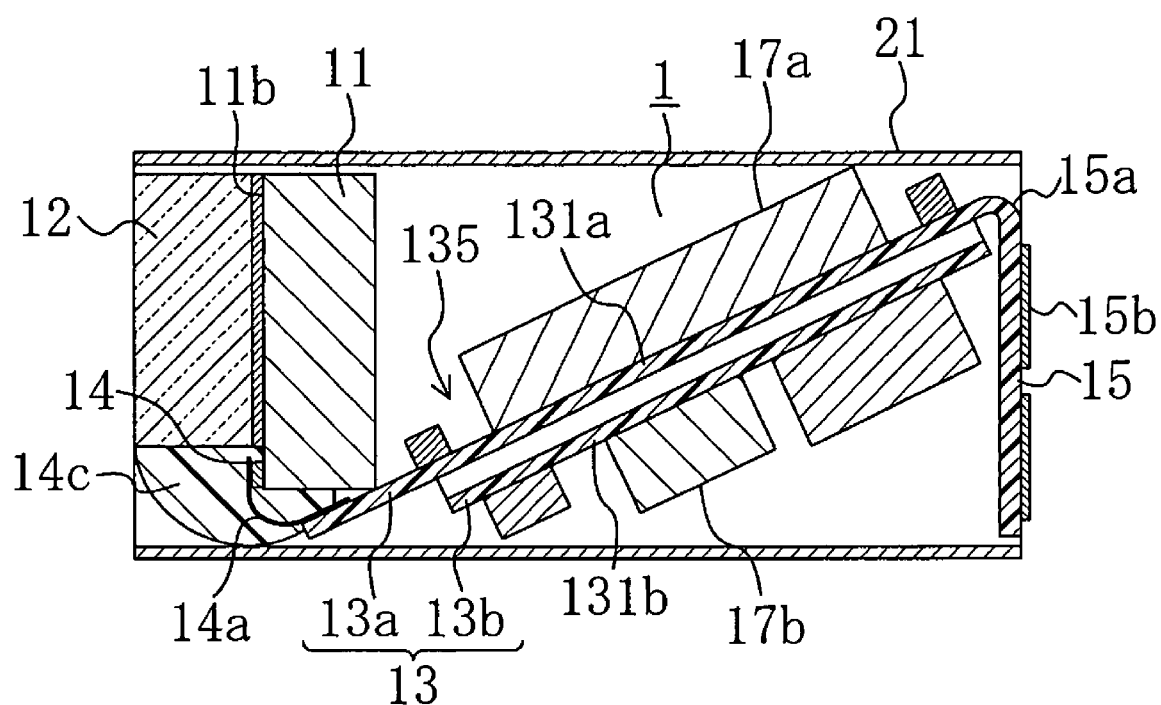
FIG. 3 is a conceptual cross-sectional view showing the structure of a camera unit according to the first embodiment.

FIG. 3 is a conceptual cross-sectional view showing the structure of a camera unit (an optical device unit) in which the above solid-state image sensing device module 1 is contained in a rectangular tubular housing 21.

As shown in FIG. 3, the camera unit 2 is configured so that a flexible and compliant solid-state image sensing device module 1 of Z-shaped cross section having the configuration shown in FIGS. 1 and 2 is contained in a rectangular tubular small housing 21 of specified dimensions. Since the camera unit 2 is required to be of small size, the end opening of the tubular housing 21 is formed to be slightly larger than the size (profile and area) of the light acceptance surface 11b of the solid-state image sensing device module 1 (into a size determined by taking into consideration the workability of insertion). However, because of flexibility of the flexible substrate 13, particularly the flexibility of the first and second bent parts 14a and 15a, the solid-state image sensing device module 1 deforms when inserted into the tubular housing 21. Therefore, the solid-state image sensing device module 1 can be easily inserted into the housing 21, which provides insertion work at low cost. Furthermore, when the solid-state image sensing device module 1 is in the tubular housing 21, the camera unit 2 is configured so that the solid-state image sensing device module 1 partly comes into contact with the inside surface of the tubular housing 21 and the flexible substrate 13 is bowed. The flexible substrate 13 in the tubular housing 21 is partly deformed by the application of stress.

Although in the above the description is given taking as an example the case where the tubular housing 21 of the camera unit 2 has a rectangular box shape, the camera unit 2 may have a cylindrical outer shape and a rectangular inner space and contain the solid-state image sensing device module 1 in the rectangular space. This facilitates the optical alignment with optical elements.

-Fabrication of Solid-State Image Sensing Device Module-

Figure 4A:
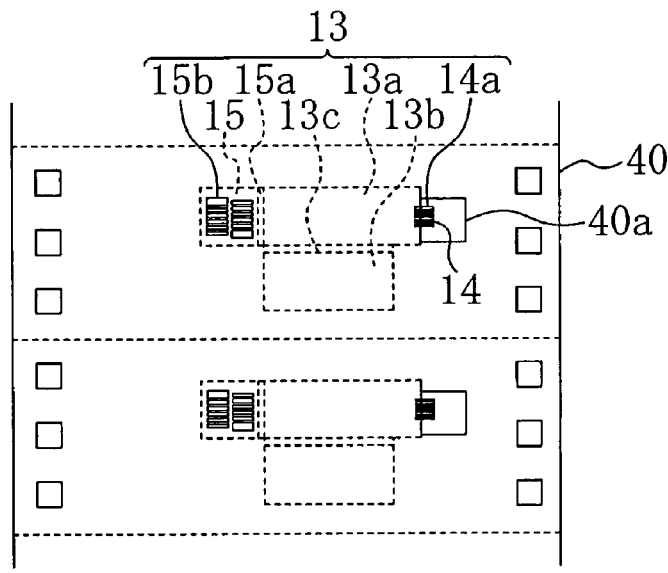
FIG. 4 shows conceptual plan views illustrating some process steps of a fabrication method of the solid-state image sensing device module according to the first embodiment.
Figure 4B:
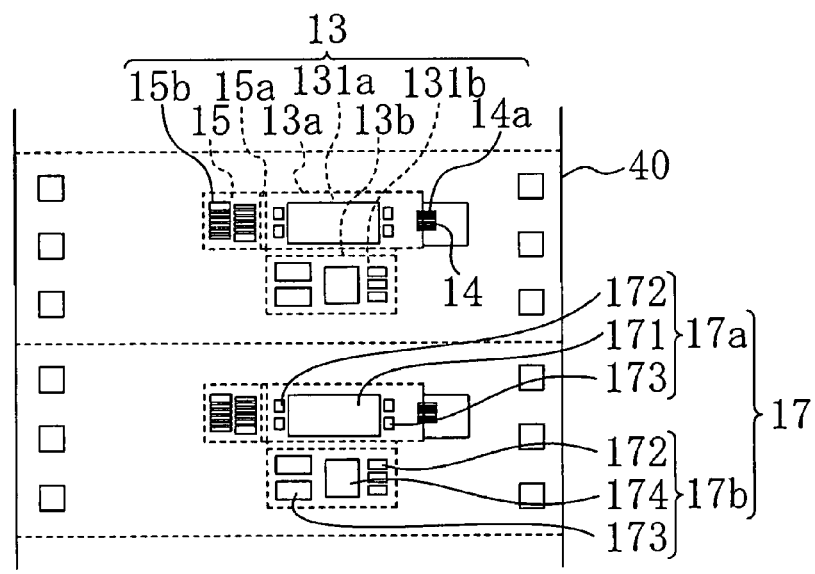
Figure 4C:
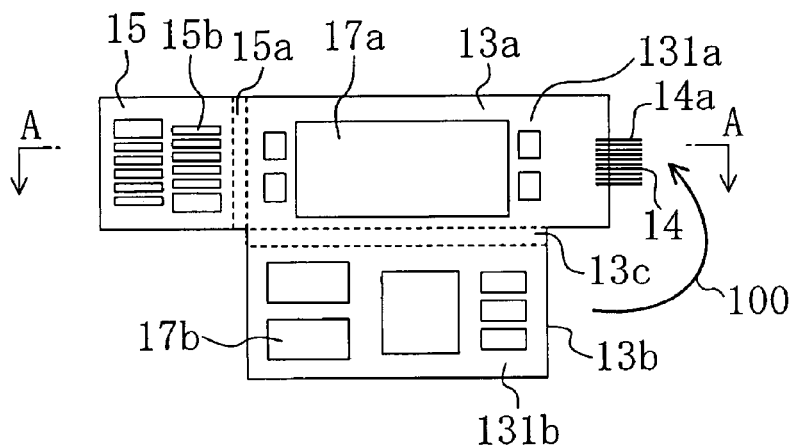

FIGS. 4 and 5 show conceptual diagrams illustrating process steps of a fabrication method of the solid-state image sensing device module 1 according to this embodiment. FIG. 4 shows conceptual plan views illustrating some of the process steps and FIG. 5 shows conceptual cross-sectional views taken along the line A-A of FIG. 4(c) after the second mounting region 13b is folded back to the back surface of the first mounting region 13a as shown in the arrow 100. Note that in the following example the same components and parts as in FIGS. 1 and 2 are partly designated by the same reference numerals and partly not given the reference numerals.

First, a CCD solid-state image sensing device 11 in a chip form is prepared, although not shown.

Then, as shown in FIG. 4(a), an elongated film carrier tape 40, on which a plurality units of wiring patterns (not shown) for flexible substrates 13 are formed, is prepared on a flexible base material made of, for example, a polyimide resin film. Each flexible substrate 13 includes a contact terminal part 14 at one end, an external connection part 15 at the other end, a first mounting region 13a between the contact terminal part 14 and the external connection part 15 and a second mounting region 13b connecting through a connecting region 13c with the first mounting region 13a. A unit of wiring pattern is formed on the substrate principal surfaces 131a and 131b that are one surfaces of the first and second mounting regions 13a and 13b. The unit of wiring pattern is connected to the contact terminal part 14 and the external lead-out electrodes 15b. The wiring pattern is formed, together with the contact terminal part 14 and the external connection part 15, by attaching, for example, a copper foil, onto the substrate principal surfaces 131a and 131b and pattern-etching the copper foil. A region of the film corresponding to the first bent part 14a and the contact terminal part 14 in each unit of wiring pattern is selectively removed to form a film hole 40a prior to the formation of wiring patterns, whereby a part of the copper foil wiring pattern is projected from a film edge. The projected part of the copper foil wiring pattern constitutes the fist bent part 14a and the contact terminal part 14 serving as lead terminals for inner lead boding.

Next, as shown in FIG. 4(b), two sets of separately prepared electronic componentry 17a and 17b are put on specified positions of the respective substrate principal surfaces 131a and 131b of the first and second mounting regions 13a and 13b. Then, the first set of electronic componentry 17a and the second set of electronic componentry 17b are connected to the wiring pattern by soldering and thereby mounted onto the substrate principal surfaces 131a and 131b, respectively. The two sets of electronic componentry 17a and 17b used include, for example, a semiconductor device (a driver IC chip) 171, a transistor 174, a chip resistor 172 and a chip capacitor 173. The semiconductor device 171 serving as a driver IC chip may be connected via solder balls by flip chip bonding or wafer level chip size packaging or may be connected by wire bonding.

Thereafter, as shown in FIG. 4(c), the film carrier tape 40 on which electronic components are mounted is punched out in individual units of flexible substrates 13 to form a plurality of separated flexible substrates 13. Then, as shown in the arrow 100 of FIG. 4(c), the second mounting region 13b having the second set of electronic componentry 17b mounted thereon is folded back 180° at the connecting region 13c towards the back surface of the first mounting region 13a to place the second set of electronic componentry 17b to the back surface of the first mounting region 13a. Thus, the plurality of electronic components 17a and 17b necessary to constitute a peripheral circuit for driving the solid-state image sensing device 11 can be compactly mounted by a simple method, thereby providing low-cost fabrication of small-sized solid-state image sensing devices.

Figure 5A:
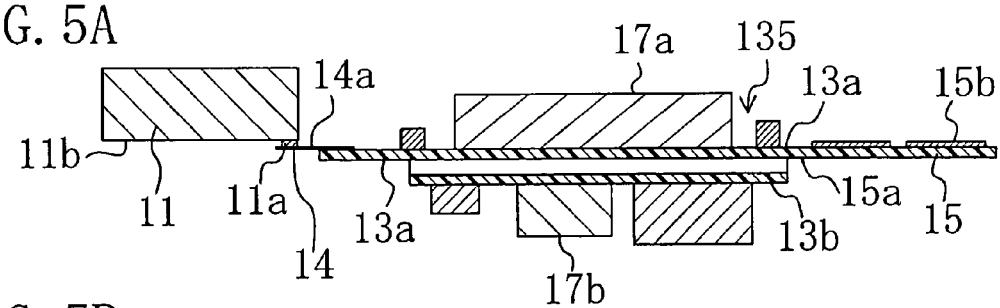
FIG. 5 shows conceptual cross-sectional views illustrating other process steps of the fabrication method of the solid-state image sensing device module according to the first embodiment.

Then, as shown in FIG. 5(a), bumps 11a formed on part of an edge of the solid-state image sensing device 11 are connected to the contact terminal part 14 by inner lead bonding (ILB).

Figure 5B:
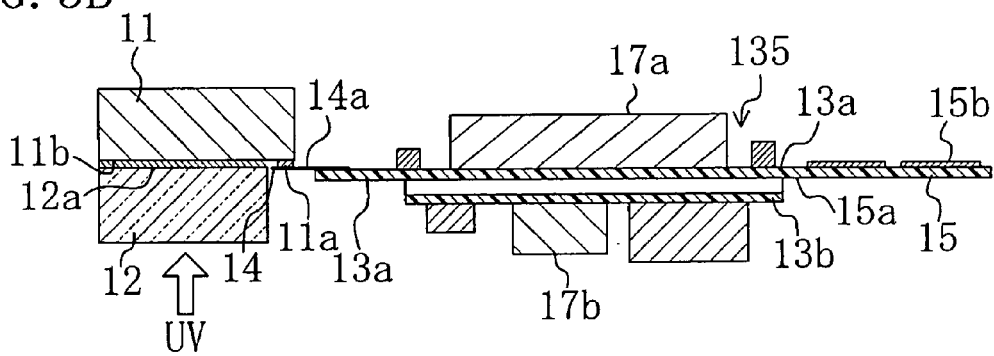

Next, as shown in FIG. 5(b), a transparent adhesive 12a, such as a UV curable resin, is applied on the light acceptance surface 11b of the prepared solid-state image sensing device 11 and an optical element 12, such as a clear glass plate, is mounted on the light acceptance surface 11b. Then, ultraviolet (UV) light is radiated to the transparent adhesive 12a through the optical element 12, thereby curing the transparent adhesive 12a.

Examples of the optical element 12 used include Terex® glass, Pyrex® glass and quartz. Examples of the transparent adhesive 12a used include UV curable or thermosetting adhesives having smaller refractive indices than the optical element 12, such as acryl resin, polyimide resin and epoxy resin. The use of the optical element 12 prevents the light acceptance surface 11b from being covered with dust and damaged, which improves the quality of the solid-state image sensing device module 1 and downsizes the solid-state image sensing device module 1. Then, at least the portion of the contact terminal part 14 connected to the solid-state image sensing device 11 by ILB is reinforced by a thermosetting reinforcing resin (not shown), such as epoxy resin adhesive.

Figure 5C:
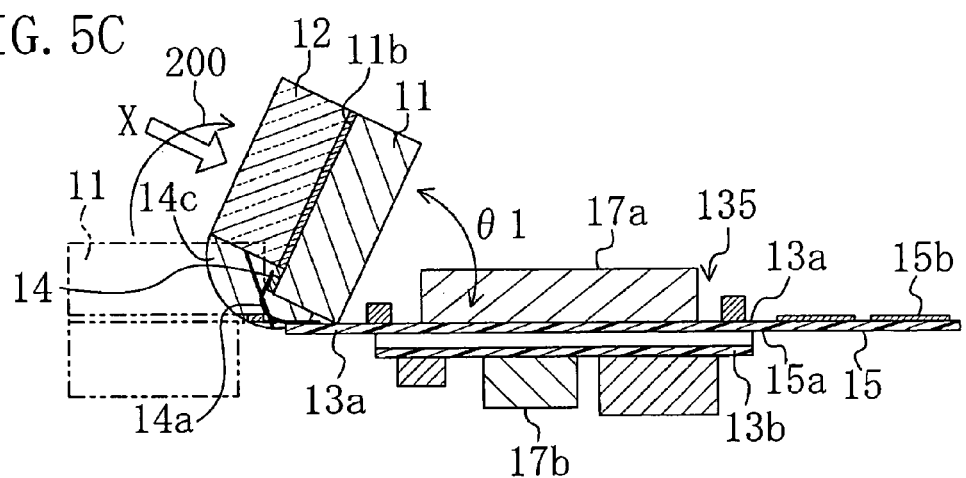

Thereafter, as shown in FIG. 5(c), the connected solid-state image sensing device 11 is bent out at the first bent part 14a from the mounting part 135 according to the arrow 200 so that the light acceptance surface 11a is oriented in the image sensing direction (the direction of the arrow X) and the back surface of the solid-state image sensing device 11 opposite to the light acceptance surface 11a makes a specified acute angle $\theta 1$ with the mounting part 135. Then, with the solid-state image sensing device 11 bent out, the bumps 11a of the solid-state image sensing device 11, their surrounding area, the contact terminal part 14, part of one side surface of the optical element 12, the first bent part 14a and one end of the mounting part 135 are covered with a reinforcing resin 14c. The reinforcing resin 14c is applied by extrusion as through a nozzle and then cured by heat. Thus, the bumps 11a of the solid-state image sensing device 11, their surrounding area, the contact terminal part 14, part of one side surface of the optical element 12, the first bent part 14a and one end of the mounting part 135 are fixed and the connecting part between the bumps 11a and the contact terminal part 14 and the first bent part 14a are reinforced. An example of the reinforcing resin 14c preferably used is a thermosetting epoxy resin adhesive.

According to the above process steps, the connection reliability between the solid-state image sensing device 11 and the contact terminal part 14 can be enhanced and the light acceptance surface 11b and the mounting part 135 can be fixed at a specified angle $\theta 1$ to improve the mechanical strength of the belt part. At this time, at least one end of the first mounting region 13a of the flexible substrate 13 is fixed inclined to the back surface of the solid-state image sensing device 11.

Figure 5D:
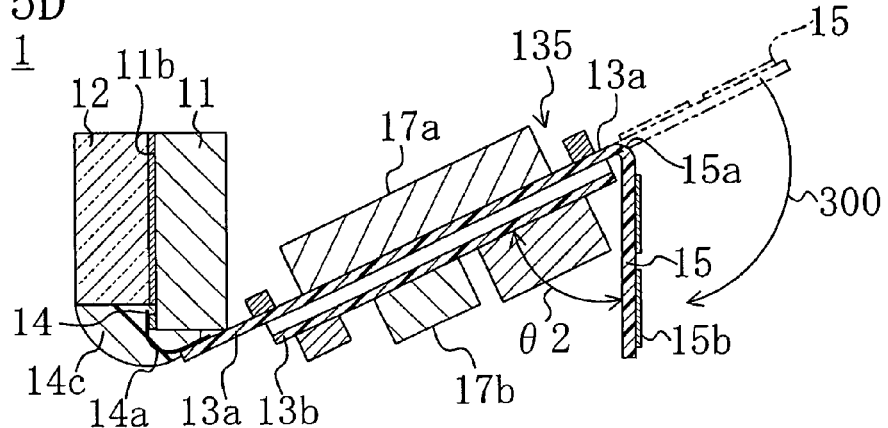

Then, as shown in FIG. 5(d), the external connection part 15 of the flexible substrate 13, which is the other end thereof, is bent out at the second bent part 15a from the mounting part 135 according to the arrow 300 so that it makes a specified acute angle $\theta 2$ with the mounting part 135 and the two acute angles $\theta 1$ and $\theta 2$ are alternate angles. As a result of the bending, the mounting part 135, the solid-state image sensing device 11 and the external connection part 15 are arranged so that their cross sections taken along a plane including the two acute angles $\theta 1$ and $\theta 2$ describe the shape of the letter Z. In this manner, the solid-state image sensing device module 1 is formed.

According to the above process steps, a solid-state image sensing device module 1 having a widened dimensional accuracy tolerance and a flexible and mechanically compliant structure can be formed in a compact size and the workability of insertion thereof into a tubular housing of specified dimensions can be improved. Furthermore, since the insertion of the solid-state image sensing device module 1 into the tubular housing can be easily carried out even if the tolerance of the dimensional accuracy of the solid-state image sensing device module 1 is widened, it can be fabricated at low cost.

-Fabrication of Camera Unit-

FIG. 6 shows conceptual cross-sectional views illustrating the process steps of inserting the above solid-state image sensing device module 1 into the tubular housing 21.

Figure 6A:
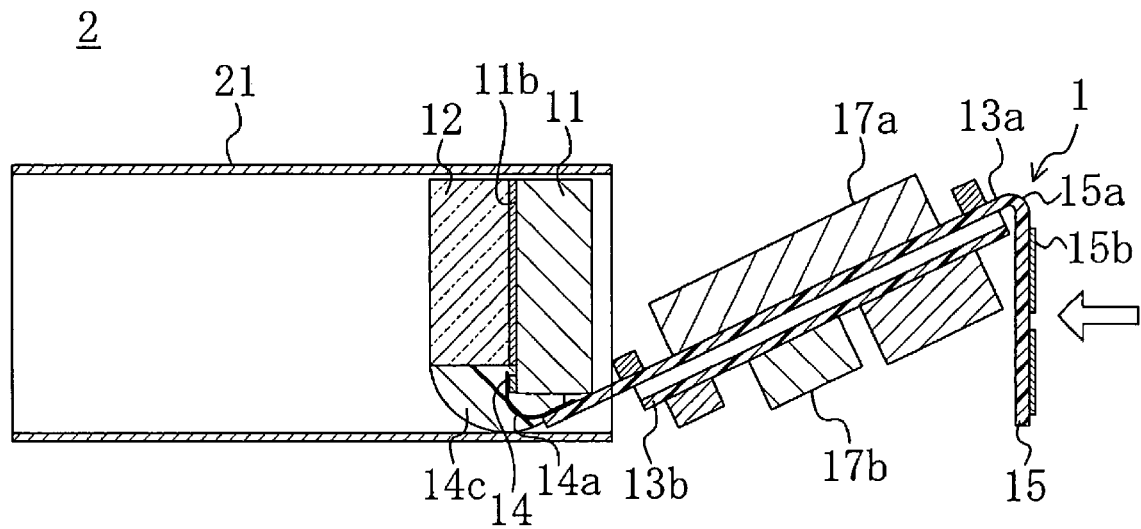
FIG. 6 shows conceptual cross-sectional views illustrating a fabrication method of the camera unit according to the first embodiment.
Figure 6B:
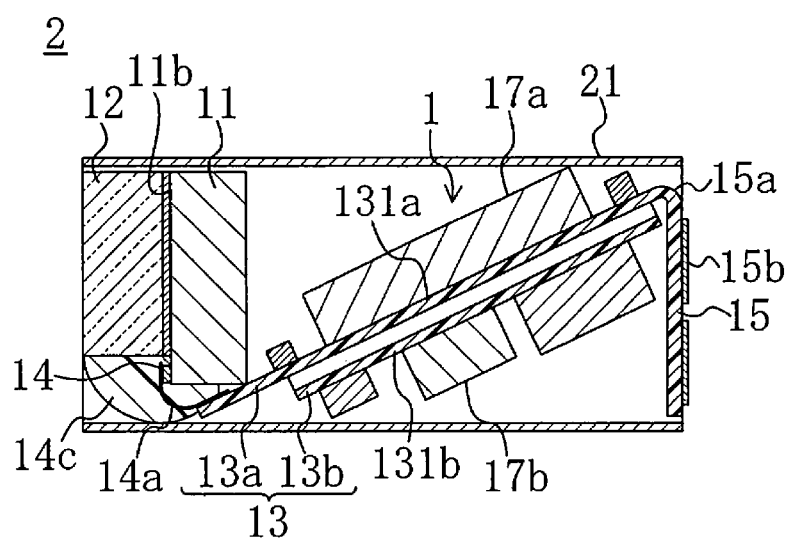

As shown in FIG. 6(a), the solid-state image sensing device module 1 formed by the above-mentioned fabrication method is inserted into the rectangular tubular housing 21 of specified dimensions for a camera unit, thereby forming a camera unit 2 as shown in FIG. 6(b). Since the solid-state image sensing device module 1 is formed into a flexible, compact structure having a widened dimensional accuracy tolerance, the inclined flexible substrate 13, particularly both ends thereof, is bowed during insertion into the tubular housing 21 and, therefore, can be inserted into the tubular housing 21 without much labor. Therefore, the solid-state image sensing device module 1 can be inserted in a short time. Furthermore, the flexible substrate 13 is placed with part thereof deformed and bowed also in the tubular housing 21.

According to the above fabrication method of the camera unit, the solid-state image sensing device module 1 can be easily inserted into the tubular housing 21 of specified dimensions which is a housing for the camera unit 2, thereby improving the insertion workability. Therefore, a compact camera unit 2 can be easily assembled and fabricated at low cost.

Second Embodiment

Figure 7A:
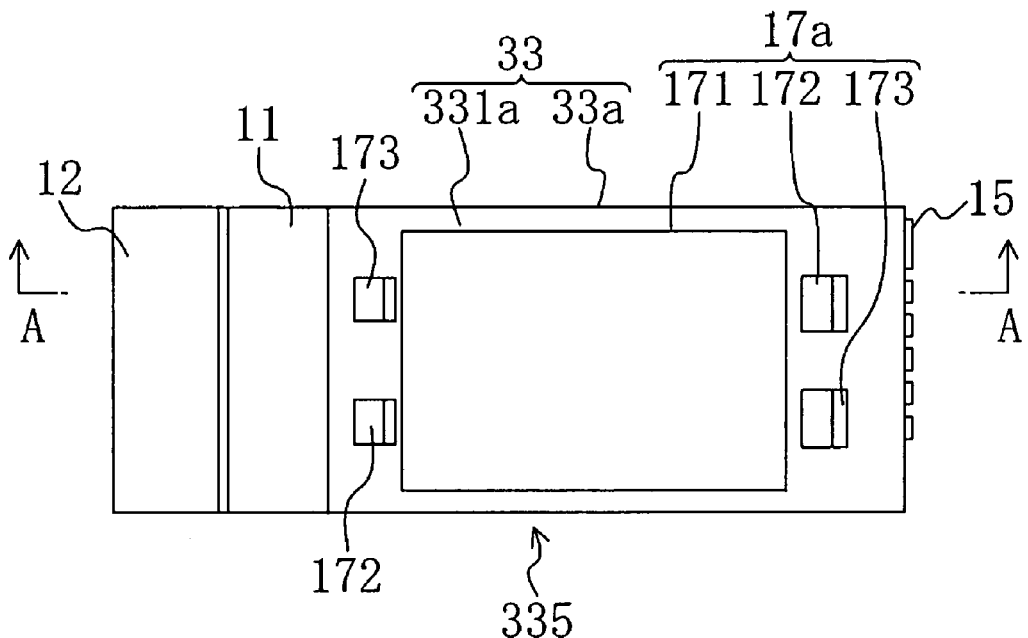
FIG. 7(a) is a conceptual plan view showing the structure of a solid-state image sensing device module according to a second embodiment of the present invention and FIG. 7(b) is a conceptual cross-sectional view taken along the line A-A of FIG. 7(a).
Figure 7B:
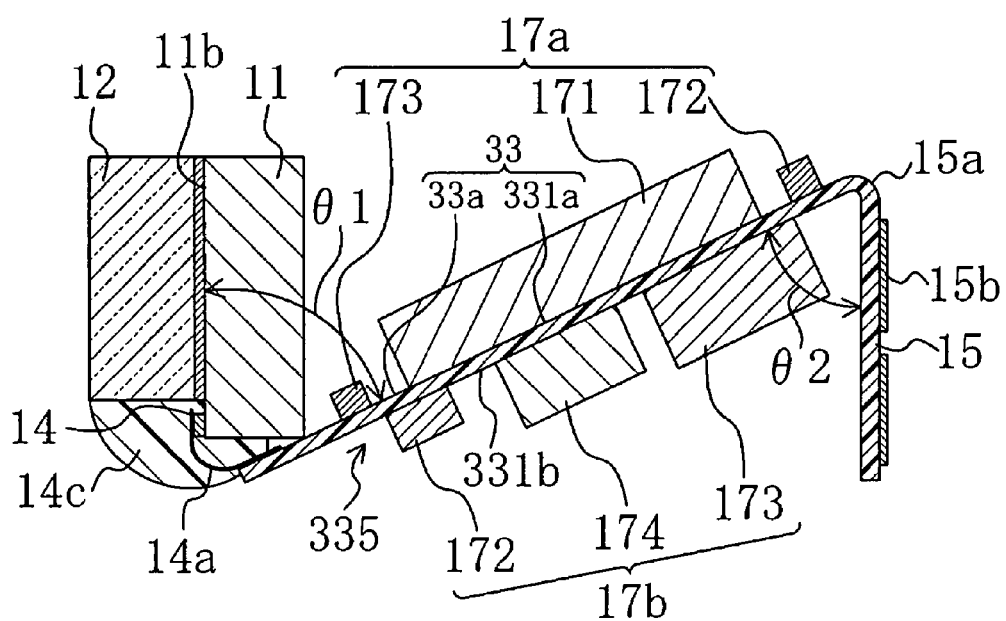

FIG. 7(a) is a conceptual plan view showing the structure of a solid-state image sensing device module 3 according to a second embodiment of the present invention and FIG. 7(b) is a conceptual cross-sectional view taken along the line A-A of FIG. 7(a). In these figures, the same components and parts as in FIG. 2 are partly designated by the same reference numerals and partly not given the reference numerals. This embodiment is different from the first embodiment in that a flexible substrate 33 is a double-sided wiring substrate on which wiring patterns (not shown) are formed on both the surfaces (both sides), a via hole (not shown) is formed in a substrate body 33a of a mounting part 335 of the flexible substrate 33 and a second set of electronic componentry is mounted on the other surface of the mounting part 335. Specifically, the first set of electronic componentry 17a and the second set of electronic componentry 17b are mounted on one surface of the flexible substrate 33 and the other surface thereof, respectively. Furthermore, some of the electronic componentry 17a mounted on one surface 331a of the flexible substrate 33 (the substrate principal surface) is electrically connected via a through electrode (not shown) disposed in the via hole to at least some of the electronic componentry 17b mounted on the other surface 331b thereof (the substrate back surface). The other points are the same as in the first embodiment and, therefore, a description thereof is not given.

In the solid-state image sensing device module 3 according to this embodiment, the through electrode is electrically connected to the wiring pattern formed on the substrate principal surface 331a of the mounting part 335 of the flexible substrate 33. The through electrode is also electrically connected to the wiring pattern (not shown) formed on the substrate back surface 331b.

According to this embodiment, since electronic components are mounted on both surfaces of the flexible substrate 33, a plurality of electronic components necessary to constitute a peripheral circuit can be compactly mounted in a narrow space, thereby providing size reduction of the solid-state image sensing device module.

Third Embodiment

Figure 8:
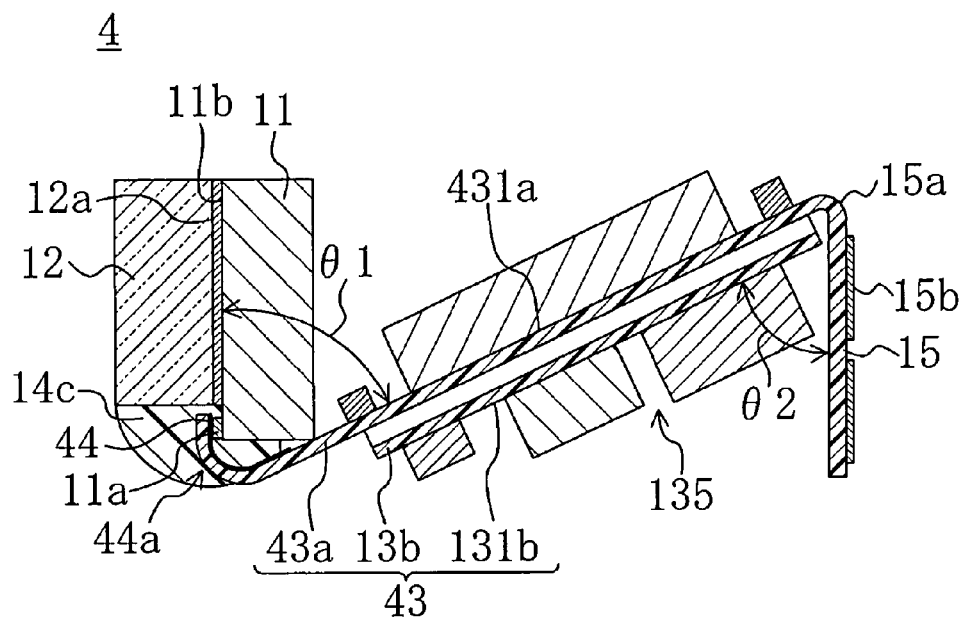
FIG. 8 is a conceptual cross-sectional view showing the structure of a solid-state image sensing device module according to a third embodiment of the present invention.

FIG. 8 is a conceptual cross-sectional view showing the structure of a solid-state image sensing device module 4 according to a third embodiment of the present invention. The same components and parts as in FIG. 2 are partly designated by the same reference numerals and partly not given the reference numerals. This embodiment is different from the first embodiment in that metal leads (wirings) are disposed on the film at a contact terminal part 44 and a first bent part 44a. The other points are the same as in the first embodiment and, therefore, a description thereof is not given.

As shown in FIG. 8, the solid-state image sensing device module 4 is formed with no film holes under the contact terminal part 44 and the first bent part 44a of a flexible substrate 43 and, therefore, the contact terminal part 44 and the first bent part 44a are supported by the film. Specifically, the contact terminal part 44 is provided on one surface (substrate principal surface) 431a of a first mounting region 43a of the flexible substrate 43 to extend to one end of the flexible substrate 43. The one end of the flexible substrate 43 is bent out at the first bent part 44a from the first mounting region 43a and the bumps 11a on an edge of the solid-state image sensing device 11 are connected to the contact terminal part 44. The connection is made not by ILB but by soldering.

According to this embodiment, since the flexible film exists under the first bent part 44a, the mechanical strength of the belt part can be enhanced.

Fourth Embodiment

Figure 9:
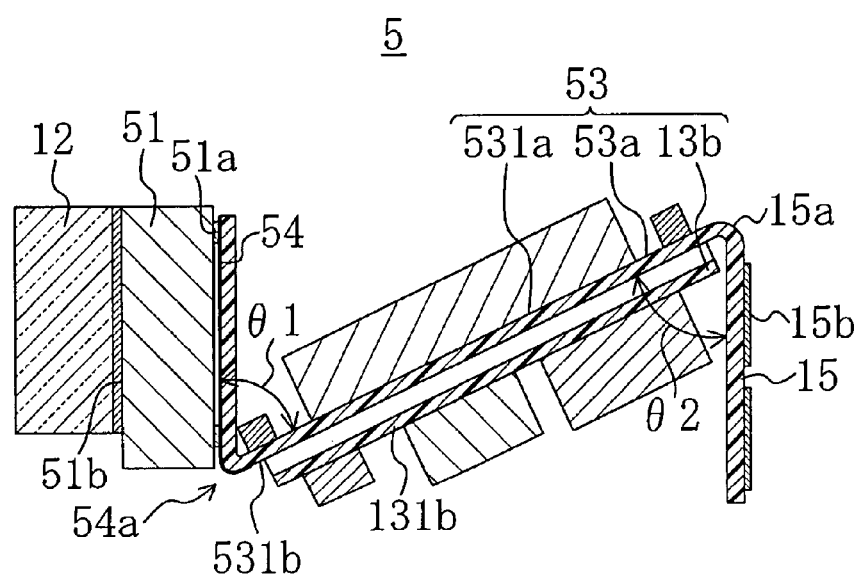
FIG. 9 is a conceptual cross-sectional view showing the structure of a solid-state image sensing device module according to a fourth embodiment of the present invention.

FIG. 9 is a conceptual cross-sectional view showing the structure of a solid-state image sensing device module 5 according to a fourth embodiment of the present invention. The same components and parts as in FIG. 2 are partly designated by the same reference numerals and partly not given the reference numerals. This embodiment is different from the first embodiment in that electrode terminals 51a for a solid-state image sensing device 51 are disposed on the opposite surface to a light acceptance surface 51b of the solid-state image sensing device 51 and a first bent part 54a and a contact terminal part 54 are supported by the film like the third embodiment. The other points are the same as in the first embodiment and, therefore, a description thereof is not given.

As shown in FIG. 9, in the solid-state image sensing device module 5, the electrode terminals 51a for the solid-state image sensing device 51 are disposed on the back surface opposite to the light acceptance surface 51b. The flexible substrate 53 is bent at the first bent part 54a and the electrode terminals 51a are connected to the contact terminal part 54. The connection is made not by ILB but by soldering. Note that the contact terminal part 54 is provided with a connection wiring (not shown) on the surface (back surface) 531b of the first mounting region 53a opposite to the principal surface 531a thereof on which electronic components are mounted and the connection wiring is electrically connected to a wiring pattern (not shown) formed on the principal surface 531a. According to the above connection, most of the back surface of the solid-state image sensing device 51 is covered and supported by the film supporting the contact terminal part In this embodiment, it is necessary to dispose the connection wiring for the contact terminal part 54 on the back surface 531b. However, since almost the entire back surface of the solid-state image sensing device 51 is supported by part of the flexible substrate 53 on which the film lies, the mechanical strength of the solid-state image sensing device can be enhanced.

Fifth Embodiment

Figure 10:
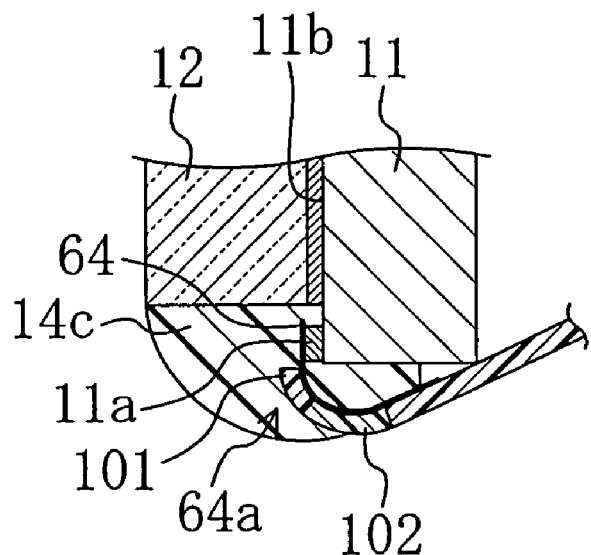
FIG. 10 is a conceptual cross-sectional view showing part of a solid-state image sensing device module according to a fifth embodiment of the present invention.

FIG. 10 is a diagram showing a first bent part 64a of a solid-state image sensing device module according to a fifth embodiment of the present invention and the surrounding area of the first bent part 64a. This embodiment is different from the first embodiment only in the configuration of the first bent part 64a and the rest of the configuration is the same as in the first embodiment. Therefore, in this embodiment, a description is given only of the different point.

In this embodiment, the first bent part 64a is composed of two parts. One of the two parts is a part which adjoins a contact terminal part 64 and in which a film 101 of same material as the film constituting part of the flexible substrate 13 is disposed under a wiring. The other is a part in which a protective film 102 having a higher flexibility than the film 101 is disposed under the wiring. According to this configuration, the first bent part 64a can be more easily bent than that in the third embodiment and more easily treated prior to the connection of the contact terminal part 64 to the solid-state image sensing device 11 than that in the first embodiment and the connection reliability can be enhanced. According to the solid-state image sensing device module of this embodiment, a film carrier tape can be fabricated by forming a film hole while leaving part of the film 101 corresponding to the first bent part 64a and forming the protective film 102 in part of the film hole.

Sixth Embodiment

Figure 11:
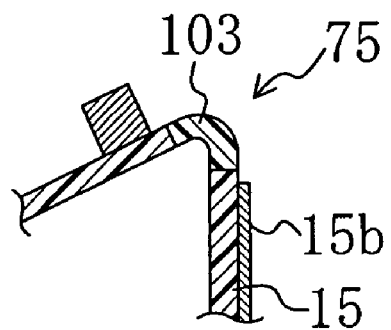
FIG. 11 is a conceptual cross-sectional view showing part of a solid-state image sensing device module according to a sixth embodiment of the present invention.

FIG. 11 is a diagram showing a second bent part 75 of a solid-state image sensing device module according to a sixth embodiment of the present invention and the surrounding area of the second bent part 75. This embodiment is different from the first embodiment in the configuration of the second bent part 75 and the rest of the configuration is the same as in the first embodiment. Therefore, in this embodiment, a description is given only of the different point.

In this embodiment, part of the film corresponding to the second bent part 75 is removed and a protective film 103 having a higher flexibility than the film is provided instead. A wiring pattern (not shown) lies on the protective film 103. Such a configuration makes the second bent part 75 in this embodiment more likely to be bent than those in the other embodiments. According to the solid-state image sensing device module of this embodiment, a film carrier tape can be fabricated by removing part of the film corresponding to the second bent part 75 to form a film hole and forming the protective film 103 in the film hole.

Seventh Embodiment

Figure 12:
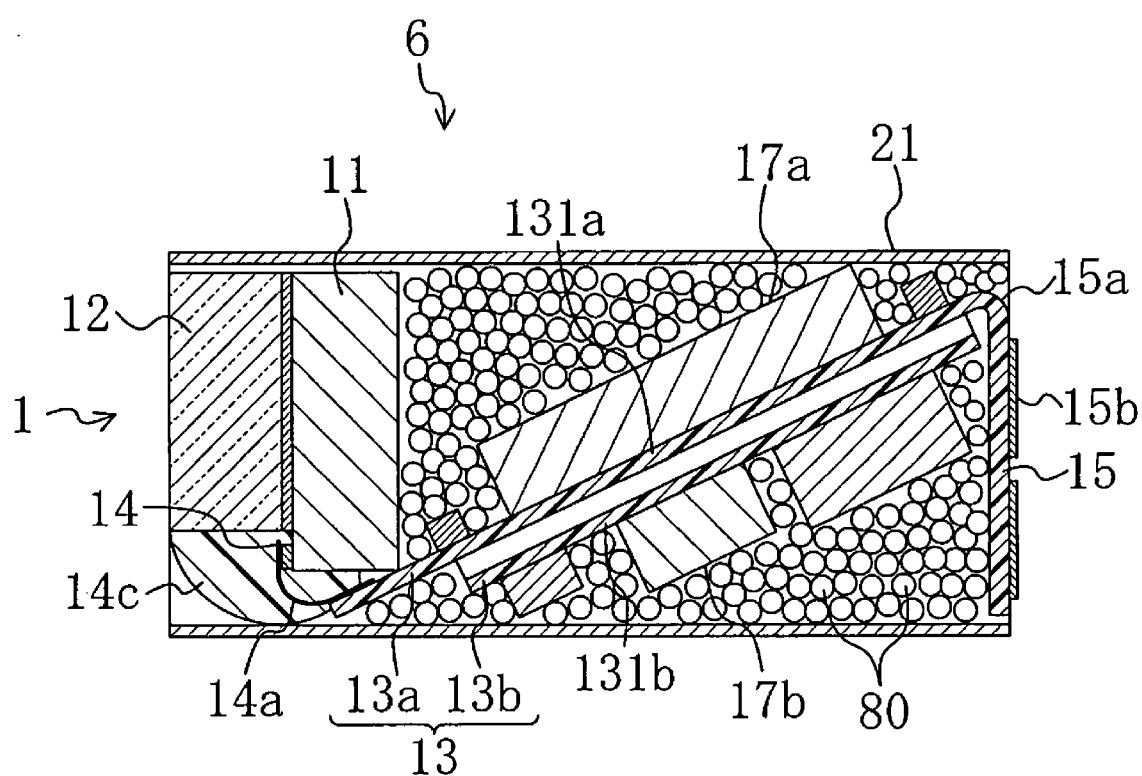
FIG. 12 is a conceptual cross-sectional view showing the structure of a camera unit according to a seventh embodiment of the present invention.
Figure 13:
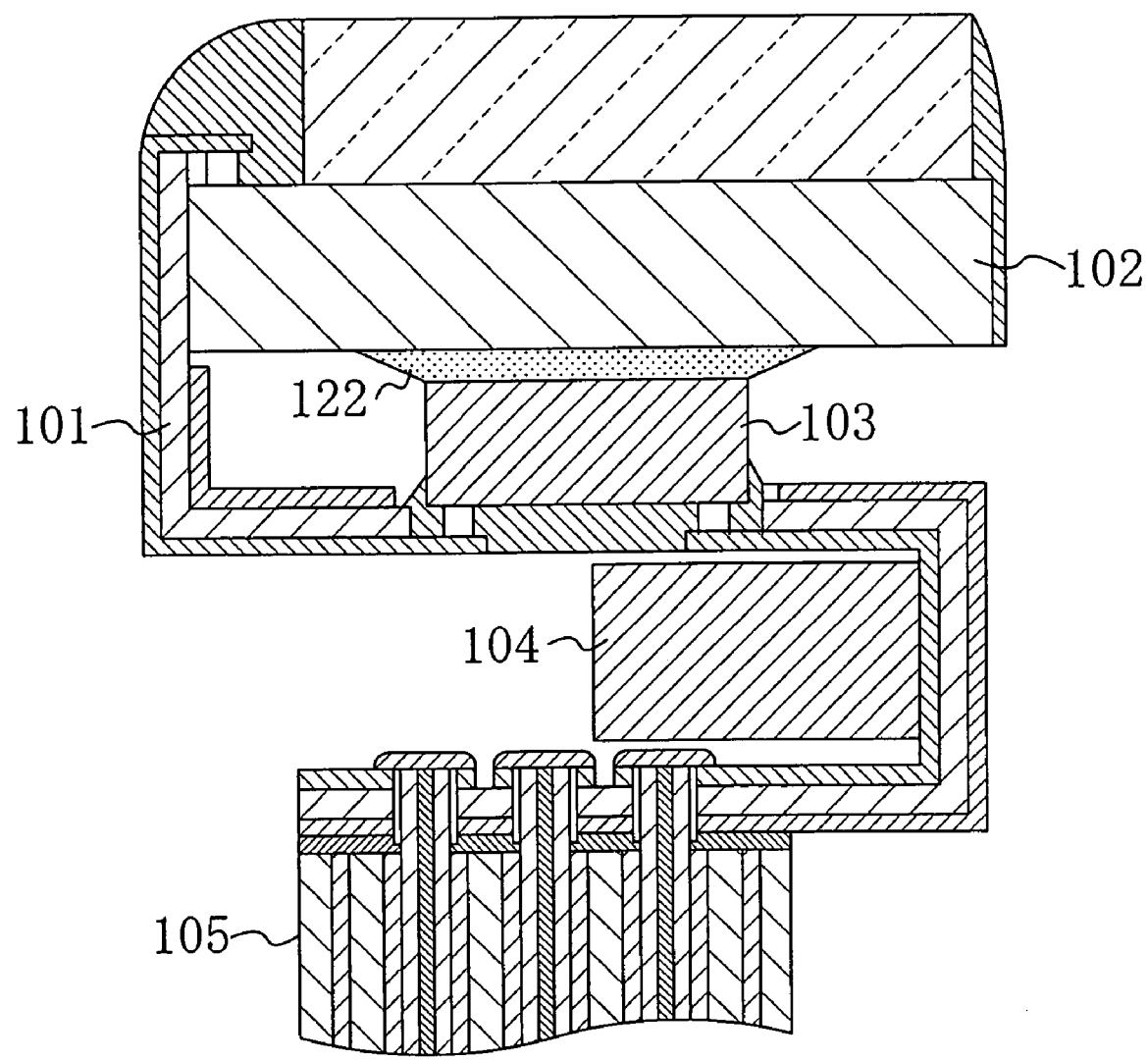
FIG. 13 is a conceptual cross-sectional view showing the structure of a conventional solid-state image sensing device module.

FIG. 12 is a conceptual cross-sectional view of a camera unit 6 according to a seventh embodiment of the present invention. This embodiment is different from the first embodiment in that a heat sink material 80 is contained in the tubular housing 21 and the rest of the configuration is the same as in the first embodiment.

The camera unit 6 according to this embodiment is fabricated by putting a granular heat sink material 80 into the tubular housing 21 in inserting the solid-state image sensing device module 1 into the tubular housing 21. The heat sink material 80 occupies almost all of the inner space of the tubular housing 21 other than the space occupied by the solid-state image sensing device module 1 and acts to quickly transmit heat produced by the solid-state image sensing device 11 and the electronic componentry 17a and 17b to the tubular housing 21 to release it, thereby preventing the temperature of the solid-state image sensing device module 1 from being excessively raised. Therefore, according to this embodiment, the reliability of the camera unit 6 can be enhanced. The heat sink material 80 has electrical insulation at least at its surface, which prevents the solid-state image sensing device module 1 from being short-circuited. Examples of the heat sink material 80 used include Al whose surface is subjected to electric insulating treatment and an Cu alloy. These heat sink materials have a heat conductivity 100 times or more that of air at normal temperature. The heat sink material 80 may be in granular form or a lump of wire wool such as steel scrubbing brush.

Other Embodiments

The above embodiments are illustrative only and the present invention is not limited to these embodiments. For example, although in the first to fourth embodiments the solid-state image sensing device is not packaged but provided by adhering an optical element to its light acceptance surface, the solid-state image sensing device may be packaged with the optical element sealed away from the light acceptance surface. This enhances the reliability. The solid-state image sensing device 11, 51 applicable to the present invention is not limited to the CCD and may be a static induction transistor image sensing device (SIT) or a charge modulation image sensing device (CMD).

The flexible substrate is not limited to a TAB substrate having a wiring pattern on a single surface but may be a flexible substrate having wiring patterns on both the surfaces or a flexible substrate formed of three laminated layers.

In the third embodiment, the part of the contact terminal part 44 connected to the bumps Ha may not be provided with a film serving as a support. In other words, the contact terminal part 44 may be formed of leads projecting outwardly from a film edge.

The solid-state image sensing device module according to the present invention may be formed of a combination of features of the above embodiments. For example, a combination of the second and fourth embodiments enables an effective utilization of a double-sided wiring substrate in the electric connection with a solid-state image sensing device.

The heat sink material 80 may be in any form, such as granular form, fibrous form or powder form.

According to the optical device module of the present invention, a flexible substrate on which a plurality of electronic components are mounted is connected to an optical device and the flexible substrate is bent at acute angles at its first and second bent parts to form alternate angles. Therefore, the optical device module can have a compact, flexible structure and a widened dimensional accuracy tolerance, which facilitates the insertion into a housing of specified dimensions. As a result, a compact, low-price optical device unit can be provided.

What is claimed is:

1. An optical device module including an optical device, a flexible substrate connected to the optical device and electronic componentry mounted on the flexible substrate, the flexible substrate comprising:
    a contact terminal part located at one end of the flexible substrate and connected to the optical device;
    an external connection part located at the other end of the flexible substrate and having an external electrode configured to be connected to an external device, one end of the external connection part opposite to the second bent part having a cut-off shape;
    a mounting part which is flexible and on which the electronic componentry is mounted, the mounting part being located between the contact terminal part and the external connection part;
    a first bent part located between the mounting part and the contact terminal part; and
    a second bent part located between the mounting part and the external connection part,
    the flexible substrate being bent at the first bent part so that a back surface of the optical device opposite to an optically functional surface thereof makes a first acute angle with the mounting part of the flexible substrate, and the flexible substrate being bent at the second bent part so that the external connection part makes a second acute angle with the mounting part, and the first acute angle and the second acute angle are in relation of alternate angles.

2. The optical device module of claim 1, wherein:
    the electronic componentry comprises a plurality of electronic components,
    the mounting part of the flexible substrate comprises a first mounting region on which some of the plurality of electronic components are mounted, a second mounting region on which the rest of the plurality of electronic components are mounted and a connecting region connecting the first and second mounting regions, and
    the mounting part is bent at the connecting region.

3. The optical device module of claim 2, wherein:
    each of the first and second mounting regions has a mounting surface on which the electronic componentry is mounted and a non-mounting surface opposite to the mounting surface, and
    the mounting part is bent at the connecting region so that the non-mounting surfaces of the first and second mounting regions face each other.

4. The optical device module of claim 1, wherein
    the flexible substrate further comprises a through electrode,
    the electronic componentry comprises at least one electronic component mounted on one surface of the flexible substrate and at least one electronic component mounted on the other surface of the flexible substrate, and
    the through electrode electrically connects said at least one electronic component mounted on the one surface of the flexible substrate to said at least one electronic component mounted on the other surface of the flexible substrate.

5. The optical device module of claim 1, wherein the optical device is a solid-state image sensing device.

6. The optical device module of claim 5, wherein a transparent material is adhered to the light acceptance surface of the solid-state image sensing device.

7. The optical device module of claim 1, wherein the flexible substrate is formed of a film carrier tape and a film is removed in the first bent part.

8. The optical device module of claim 1, wherein a protective film is provided over the first bent part.

9. The optical device module of claim 7, wherein the film is removed in the second bent part and a protective film is instead provided over the second bent part.

10. The optical device module of claim 1, wherein a reinforcing resin is disposed on the contact terminal part.

11. An optical device unit comprising:
    the optical device module of claim 1; and
    a housing containing the optical device module,
    the flexible substrate in the housing being partly deformed by the application of stress.

12. The optical device unit of claim 11, wherein the housing further contains a heat sink material at least the surface of which has electrical insulation.

13. A method for fabricating an optical device module comprising an optical device, a flexible substrate connected to the optical device and electronic componentry mounted on the flexible substrate, the method comprising the steps of:
  preparing the flexible substrate which comprises a contact terminal part located at one end of the flexible substrate for being connected to the optical device, an external connection part located at the other end of the flexible substrate for being connected to an external device and a mounting part located between the contact terminal part and the external connection part and allowing a plurality of electronic components to be mounted thereon and on a surface of which a wiring pattern is formed;
  mounting the plurality of electronic components on the mounting part of the flexible substrate;
  electrically connecting the contact terminal part of the flexible substrate to the optical device;
  bending a part of the flexible substrate adjacent to the contact terminal part so that the back surface of the optical device opposite to an optically functional surface thereof makes an acute angle with the mounting part; and
  bending another part of the flexible substrate adjacent to the external connection part so that the external connection part makes an acute angle with the mounting part and the acute angle between the external connection part and the mounting part and the acute angle between the back surface of the optical device and the mounting part are alternate angles.

14. A method for fabricating an optical device unit comprising the optical device module of claim 1 and a housing containing the optical device module, the method comprising the steps of:
  preparing the optical device module; and
  inserting the optical device module into the housing so that the optical device module is contained in the housing with the flexible substrate partly deformed by the application of stress.

15. The method of claim 14, further comprising the step of containing into the housing a heat sink material at least the surface of which has electrical insulation.

16. The optical device module of claim 1, wherein only the first acute angle and the second acute angle are formed between the back surface of the optical device and the external connection part in the length direction of the flexible substrate.

17. The optical device module of claim 1, wherein each of the mounting part and the external connection part is substantially flat.

18. The optical device module of claim 17, wherein the back surface of the optical device and the external connection part are substantially parallel.

19. The optical device module of claim 1, wherein the contact terminal part is bent only in a clockwise direction with respect to the mounting part to make the first acute angle and the external connection part is bent only in a clockwise direction with respect to the mounting part to make the second acute angle.

20. The optical device module of claim 2, wherein the mounting part is bent at the connecting region along a direction perpendicular to a direction along which the flexible substrate is bent at the first and second bent parts.

* * * * *